(12) United States Patent
Lee et al.

(10) Patent No.: US 8,334,027 B2
(45) Date of Patent: Dec. 18, 2012

(54) METHOD FOR DC PLASMA ASSISTED CHEMICAL VAPOR DEPOSITION IN THE ABSENCE OF A POSITIVE COLUMN

(75) Inventors: Wook-Seong Lee, Seoul (KR); Young-Joon Baik, Seoul (KR); Jeung-Hyun Jeong, Gyeonggi-do (KR); Ki-Woong Chae, Chungcheongnam-Do (KR)

(73) Assignee: Korea Institute of Science and Technology (KR)

( * ) Notice: Subject to any disclaimer, the term of this patent is extended or adjusted under 35 U.S.C. 154(b) by 686 days.

(21) Appl. No.: 11/833,679

(22) Filed: Aug. 3, 2007

(65) Prior Publication Data

US 2008/0280135 A1 Nov. 13, 2008

(30) Foreign Application Priority Data

May 10, 2007 (KR) .................. 10-2007-0045695

(51) Int. Cl.
*H05H 1/24* (2006.01)
(52) U.S. Cl. .................... 427/577; 427/249.8
(58) Field of Classification Search .............. 427/577, 427/573, 575, 249.8
See application file for complete search history.

(56) References Cited

U.S. PATENT DOCUMENTS

| | | | | |
|---|---|---|---|---|
| 3,876,305 A * | 4/1975 | Gough et al. | .................. | 356/314 |
| 4,821,281 A * | 4/1989 | Lind et al. | .................. | 372/94 |
| 4,910,079 A * | 3/1990 | Shroff et al. | .............. | 428/306.6 |
| 5,007,373 A | 4/1991 | Legg et al. | | |
| 5,104,509 A * | 4/1992 | Buck et al. | .............. | 204/192.38 |
| 5,523,121 A | 6/1996 | Anthony et al. | | |
| 5,776,553 A * | 7/1998 | Jaffe et al. | .................... | 427/577 |
| 5,932,302 A * | 8/1999 | Yamazaki et al. | ........... | 427/577 |
| 6,042,900 A | 3/2000 | Rakhimov et al. | ........... | 427/577 |
| 6,161,499 A * | 12/2000 | Sun et al. | .................. | 118/723 E |
| 6,200,652 B1 * | 3/2001 | Sun et al. | ..................... | 427/573 |
| 6,399,151 B2 * | 6/2002 | Lee et al. | .................. | 427/249.8 |
| 6,533,916 B1 * | 3/2003 | Puetter et al. | ................. | 205/188 |
| 6,786,176 B2 | 9/2004 | Lee et al. | .................. | 118/723 E |
| 2001/0036789 A1 * | 11/2001 | Vion | ................. | 445/6 |
| 2004/0069230 A1 | 4/2004 | Fukuoka et al. | | |
| 2004/0115614 A1 * | 6/2004 | Burnett et al. | .................. | 435/4 |
| 2005/0031785 A1 * | 2/2005 | Carlisle et al. | ............. | 427/249.8 |
| 2005/0051772 A1 * | 3/2005 | Kawasaki et al. | .............. | 257/59 |
| 2005/0202173 A1 * | 9/2005 | Mills | ...................... | 427/249.7 |
| 2006/0138896 A1 * | 6/2006 | Makansi | .................. | 310/306 |
| 2006/0219158 A1 * | 10/2006 | Breidt et al. | .................. | 117/68 |

FOREIGN PATENT DOCUMENTS

| | | | |
|---|---|---|---|
| JP | 2-133398 | * | 5/1990 |
| JP | 2003-268541 | | 9/2003 |
| KR | 10-2007-0020465 | | 2/2007 |
| WO | WO 02/31839 | | 4/2002 |
| WO | WO 02/031839 | | 4/2002 |

OTHER PUBLICATIONS

Schlemm, H., et al., "Atmospheric pressure plasma processing with microstructure electrodes and microplanar reactors". Surface and Coatings Technology 142-144 (2001) pp. 272-276.*
Wood, P., et al., "Preparation of Polycrystalline Diamond Films in a Parallel-Plate RF Deposition System". Science and Technology of New Diamond, edited by S. Saito et al., pp. 167-170, 1990.*
Lee, Hak-Joo, et al., "Ultrananocrystalline diamond film deposition by direct-current plasma assisted chemical vapor deposition using hydrogen-rich precursor gas in the absence of the positive column." Journal of Applied Physics 109, 023303 (2011), pp. 1-9.*
Saitoh, K., et al., "Role of the hydrogen plasma treatment in layer-by-layer deposition of microcrystalline silicon". Appl. Phys. Lett. 71 (23), Dec. 8, 1997, pp. 3403-3405.*
Letter from Netherland associate dated Oct. 30, 2008 forwarding the Search Report dated Oct. 29, 2008 to Japanese associate, including discussion of relevancy thereof.
Search Report issued by European Patent Office on Oct. 29, 2008 in connection with corresponding European patent application No. EP 07 11 4065.
Diagnostics of DC-Pulse $SiH_4$ Plasmas Using Laser-Induced Fluorescence and Optical Emission Spectroscopy, T. Nakano, et. al., *IEE Pro-Sci. Meas. Technol.*, vol. 141, No. 2, Mar. 1994, XP006002128.
Korean Office Action dated Aug. 20, 2008.
Untranslated Office Action issued by Korean Patent Office on Mar. 19, 2009 in connection with corresponding Korean application No. 10-2007-0045695.
Untranslated Alfred Grill, *Cold Plasma in Materials Fabrication*, Sep. 30, 2003, ISBN 8970804246, pp. 10-1 to 10-10.
English summarization of Alfred Grill, *Cold Plasma in Materials Fabrication*.

* cited by examiner

*Primary Examiner* — Bret Chen
(74) *Attorney, Agent, or Firm* — Ostrolenk Faber LLP (57) ABSTRACT

In the method for depositing a material in the absence of a positive column, a discharge is generated between a cathode and an anode disposed to face each other in a reaction chamber by applying a DC voltage therebetween, and introducing reaction gas into the reaction chamber, thereby depositing a material on a substrate mounted on the anode and serving as a part of the anode, wherein the deposition of the material on the substrate is performed under a state that a cathode glow and an anode glow exist in a form of thin layers coating respectively the surfaces of the cathode and the substrate, while a positive column does not exist or is so small as to be negligible.

4 Claims, 7 Drawing Sheets

FIG. 1D
THE PRESENT ART

METHOD FOR DC PLASMA ASSISTED CHEMICAL VAPOR DEPOSITION IN THE ABSENCE OF A POSITIVE COLUMN

RELATED APPLICATION

The present disclosure relates to subject matter contained in priority Korean Application No. 10-2007-0045695, filed on May 10, 2007, which is here expressly incorporated by reference in its entirety.

BACKGROUND OF THE INVENTION

1. Field of the Invention

The present disclosure relates to a DC plasma assisted chemical vapor deposition (CVD) apparatus in the absence of a positive column, a method for depositing a material in the absence of a positive column, and a diamond thin film fabricated by such method.

2. Description of the Background Art

Nano-crystalline diamond (NCD) thin films are being deposited by using the conventional apparatus for depositing a micro-crystalline diamond (MCD) thin film. However, a depositing variable different from the conventional variable for depositing an MCD thin film is being used, which may cause a depositing process to be unstable and a thin film to be non-uniform. Accordingly, the conventional apparatus and method for depositing an MCD thin film have to be considerably transformed.

The MCD thin film and the NCD thin film have been deposited by a microwave plasma CVD method and a hot filament CVD method. Using the microwave plasma CVD method, it is not possible to deposit a thin film having a large area and a microwave is not easily manipulated. Using the hot filament CVD method, a thin film having a large area is easily deposited and the fabrication cost is reduced due to employing a simple thermal decomposition process. However, since filaments are used, inconvenience may be caused, impurities may be introduced, and problems may be caused due to the thermal deposition process itself. In order to overcome these problems, new methods are required.

The present inventors devised an apparatus for depositing a diamond thin film by using a DC plasma as disclosed in U.S. Pat. Nos. 6,786,176 and 6,399,151. In this apparatus, a DC voltage is applied between two facing electrodes thus to generate a plasma therebetween. A substrate is disposed on an anode and an MCD thin film is deposited on the substrate. The DC plasma assisted chemical vapor deposition (CVD) apparatus has a simple structure, and deposits a material on a substrate with a large area. However, the apparatus for depositing an MCD thin film may encounter several problems when being applied to a method for depositing an NCD thin film. Accordingly, a new apparatus having advantages of the apparatus disclosed in U.S. Pat. Nos. 6,786,176 and 6,399,151 and useful for depositing an NCD thin film is required.

In a conventional method for depositing an NCD thin film by using a DC plasma (U.S. Pat. No. 6,042,900), a substrate is positioned below an grid-shaped anode, and a plasma is generated above the anode. This method has the advantages that overheating of the substrate is prevented and a non-conductive substrate can be used. However, the method has a limitation in that the anode has to be grid-shaped. That is, it is difficult to water-cool the anode and thus difficult to enhance the power density. Furthermore, a shadowing effect of the grid-shaped anode occurs between the plasma and the substrate, that is, a grid pattern remains on the deposited thin film. Accordingly, an apparatus for uniformly depositing a film without a grid pattern is required.

In another conventional method for depositing an NCD thin film by using a DC plasma (Gouzman et al, Diamond and Related Materials 7 (1998) 209-214), a substrate is mounted on a cathode, not on an anode. However, this method has a disadvantage in that the thin film may be degraded due to ion collision. Moreover, in this method, the anode is ring-shaped, which prevents the uniformity of deposition for large-area.

Accordingly, an apparatus for depositing an NCD thin film having two electrodes facing each other in which a substrate is mounted on an anode and the anode does not have a ring shape but can have a disc shape is required.

SUMMARY OF THE INVENTION

Therefore, it is an object of the present disclosure to provide a method and an apparatus for uniformly depositing a nano-crystalline diamond (NCD) thin film having no impurity and having excellent crystallinitiy on a substrate such as a silicon wafer for a semiconductor device by stably and uniformly performing a plasma discharge between one pair of electrodes facing each other in a reaction chamber by applying a DC voltage therebetween and by introducing reaction gas into the chamber.

To achieve these and other advantages and in accordance with the purpose of the present disclosure, as embodied and broadly described here, there is provided a method for depositing a material in the absence of a positive column, by generating a plasma discharge between a cathode and an anode disposed to face each other at a distance such as not to generate a positive column or to generate only a negligible positive column in a reaction chamber by applying a DC therebetween, and introducing reaction gas into the reaction chamber, thereby depositing a material on a substrate mounted on the anode and serving as a part of the anode, wherein the deposition of the material on the substrate is performed under a state that a cathode glow and an anode glow exist in a form of thin layers coating respectively surfaces of the cathode and the substrate, while a positive column does not exist or is so small as to be negligible.

To achieve these and other advantages and in accordance with the purpose of the present disclosure, as embodied and broadly described here, there is also provided a diamond thin film fabricated by the method.

To achieve these and other advantages and in accordance with the purpose of the present disclosure, as embodied and broadly described here, there is still also provided a DC plasma assisted chemical vapor deposition (CVD) apparatus, comprising: a reaction chamber having a gas inlet and a gas outlet; a cathode and an anode disposed to face each other in the reaction chamber; and a power supply unit for supplying a DC voltage to the cathode and the anode, whereby a deposition of a material on a substrate mounted on the anode is enabled under a state that a cathode glow and an anode glow respectively exist as thin layers coating respective surfaces of the cathode and the substrate, while a distance between the cathode and the substrate is maintained such that a positive column does not exist or is small enough to be negligible.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A to 1D are schematic views showing the change in a shape and a size of a positive column according to an inter-electrode distance, in which the inter-electrode distance is decreased in the order of FIGS. 1A, 1C and 1D, wherein FIGS. 1A, 1B and 1C are according to the conventional art, and FIG. 1D is in accordance with the present invention;

FIGS. 4A to 4D are schematic diagrams showing the change of a discharge voltage and a discharge current at the moment of the arc managing, in which

DETAILED DESCRIPTION OF THE INVENTION

Reference will now be made in detail to the preferred embodiments of the present disclosure, examples of which are illustrated in the accompanying drawings.

Figure 1A:
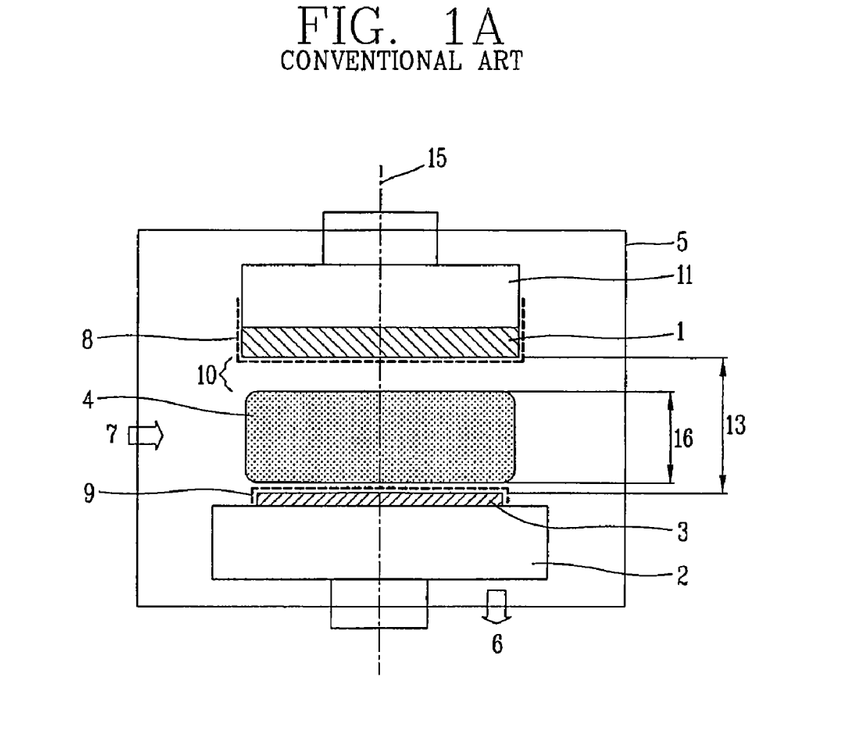
Figure 1B:
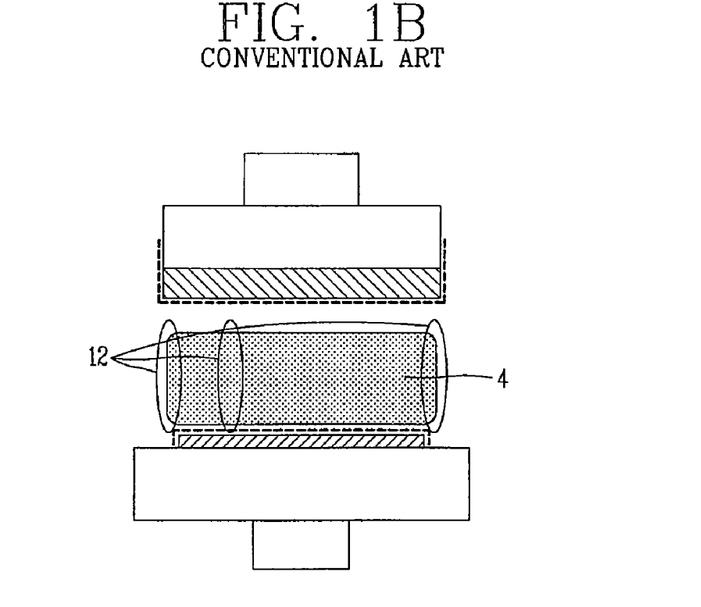
Figure 1C:
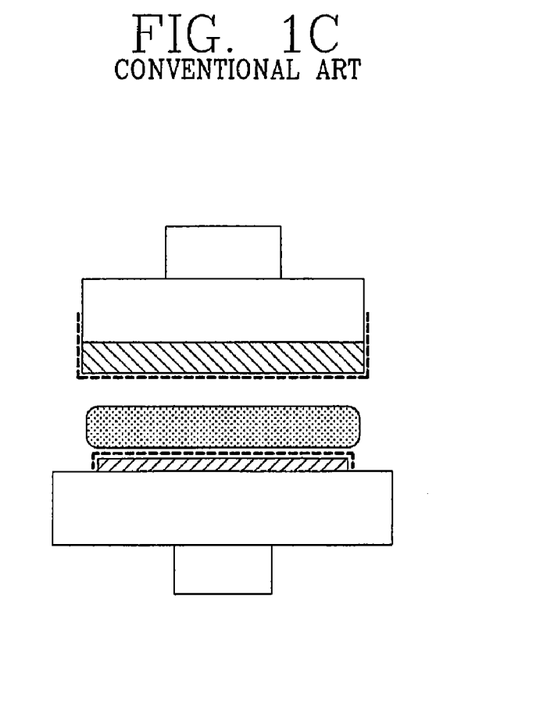
Figure 1D:
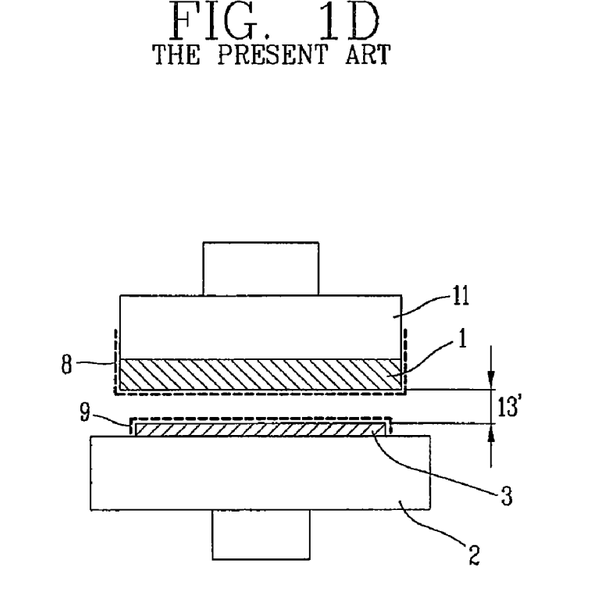

FIGS. 1A to 1D are schematic views showing the change in a shape and a size of a positive column according to the change in the inter-electrode distance, in which the inter-electrode distance is decreased in the order of FIGS. 1A, 1C and 1D, wherein FIGS. 1A, 1B and 1C are according to the conventional art, and FIG. 1D is in accordance with the present invention.

Referring to FIG. 1A, the apparatus has a structure symmetrical around a central axis 15. A substrate 3 is mounted on an anode 2 and serves as a part of the anode. A reaction chamber 5, the anode 2, and the substrate 3 are grounded. A cathode 1 is mounted on a cathode holder 11 that undergoes a water-cooling, and faces the substrate 3 mounted on the anode 2. A DC voltage is applied between the two electrodes thus to generate a so-called "positive column" 4, a cathode glow 8 (indicated by the dashed/broken line), and an anode glow 9 (indicated by the dashed/broken line). A so-called "dark space" 10 exists between an upper end of the positive column 4 and the cathode 1.

The present invention (FIG. 1D) is different from the conventional art (FIGS. 1A, 1B, and 1C) by the inter-electrode distance (13 in FIG. 1A) and according to whether a positive column phenomenon (4 in FIG. 1A) is generated. More concretely, the conventional apparatus generates a positive column 4 since the distance 13 between electrodes is long (U.S. Pat. No. 6,786,176). However, in the present invention, a positive column is not generated since the distance 13' between electrodes as shown in FIG. 1D is short.

The conventional apparatus in which a positive column is generated has the following problems when being applied to deposit a nano-crystalline diamond (NCD) thin film.

First, the substrate may become overheated, which is severely caused when a thin and light substrate such as a silicon wafer is used.

Second, power consumption for discharge is excessive.

Third, arcing frequently occurs between the cathode and the anode (or the substrate mounted on the anode), thereby damaging the substrate and the electrodes, thus disrupting the normal deposit process.

Fourth, when a plasma is formed by using mono-atomic gas such as Ar that can be easily ionized, the plasma is unstable. FIG. 1B schematically shows the unstable plasma. When a plasma is formed by using a gas such as Ar, the positive column 4 is generated as a localized positive column 12 in FIG. 1B thus disrupting the normal deposit process.

The apparatus of the present invention (FIG. 1D) solves these problems by enabling depositing of a nano-crystalline diamond thin film in the absence of a positive column, by greatly reducing the distance 13 between the electrodes.

When the distance 13 between the electrodes in FIG. 1A is decreased, the height 16 of the positive column 4 is decreased in proportion to the distance 13 thus to become the thickness shown in FIG. 1C. When the distance between the electrodes is further decreased, the height of the positive column is further decreased thus to no longer exist (FIG. 1D). However, the state, size, and shape of each of the cathode glow 8, the anode glow 9, and the cathode dark space 10 are not greatly affected according to the inter-electrode distance.

In the conventional method for depositing a diamond thin film by using a DC plasma, the generation of a positive column 4 was regarded as necessary for growing a diamond thin film. Accordingly, the conventional art was focused upon the stable and uniform generation of the positive column 4. However, the apparatus of the present invention (FIG. 1D) is able to deposit a nano-crystalline diamond (NCD) thin film of an enhanced quality in the absence of a positive column, and is superior to the conventional apparatus in the aspect of stability of discharge, a temperature control for the substrate, power efficiency, and arc control.

When the conventional apparatus is applied to deposit an NCD film, one or more localized positive columns are generated as shown in FIG. 1B. The localization becomes distinct when the ratio of Ar contained in the reaction gas is high. However, in the present invention, since the height 16 of the positive column 4 is decreased, the localization is gradually decreased and no localization occurs when the positive column does not exist at all (FIG. 1D).

At the time of an abnormal DC glow discharge, the discharge voltage necessary for maintaining a given discharge current is decreased in proportion to the inter-electrode distance (Glow Discharge Processes, by Brian Chapman, John Wiley and Sons 1980). For instance, in the conventional art, when the cathode has a diameter of approximately 130 mm and a silicon substrate which also serves as a part of the anode has a diameter of approximately 4-inches, the distance between the cathode and the substrate is maintained within a range of 25~35 mm so as to generate a positive column. Here, a discharge voltage of approximately 850~950V is necessary to maintain a discharge current of approximately 45~50A under a gas pressure of approximately 140~150 Torr. When a silicon wafer having a thickness of less than 1 mm is used as the substrate, the silicon wafer is overheated thus to disrupt a normal deposition. The reason is because the silicon wafer having a low thermal conductivity and a low mass density has a low melting point and does not have the enough thermal-contact with the water-cooling substrate holder by simply contacting a surface of the holder under its own weight. Accordingly, when a silicon wafer is used as the substrate in the conventional art, a vacuum clamping method using a vacuum chuck has to be applied (U.S. Pat. No. 6,786,176).

In the present invention, when the distance between the cathode and the substrate is maintained within a range of approximately 3~5 mm, a positive column is not generated and the discharge voltage is 400~480V which is reduced by approximately 50% under the same condition. Also, overheating of a silicon wafer is prevented without using the vacuum clamping method using a vacuum chuck, thereby enabling an enhanced deposit. Here, the power consumption is obtained by multiplying the discharge voltage by the discharge current, thereby reducing the amount of power consumption more than in the conventional art.

In the present invention, when a low discharge voltage is maintained by reducing the inter-electrode distance until a positive column is not generated, the substrate is prevented from being overheated, the power consumption is reduced, and occurrence of arcing between the cathode and the substrate is prevented.

The frequency of arcing between the electrodes in a DC plasma assisted CVD method and the intensity of arcing are proportional to the electric field strength on the electrodes. Also, the electric field on the electrodes is proportional to the discharge voltage applied between the electrodes. The present invention utilizes the principle that arcing may be prevented by lowering the discharge voltage.

Figure 2A:
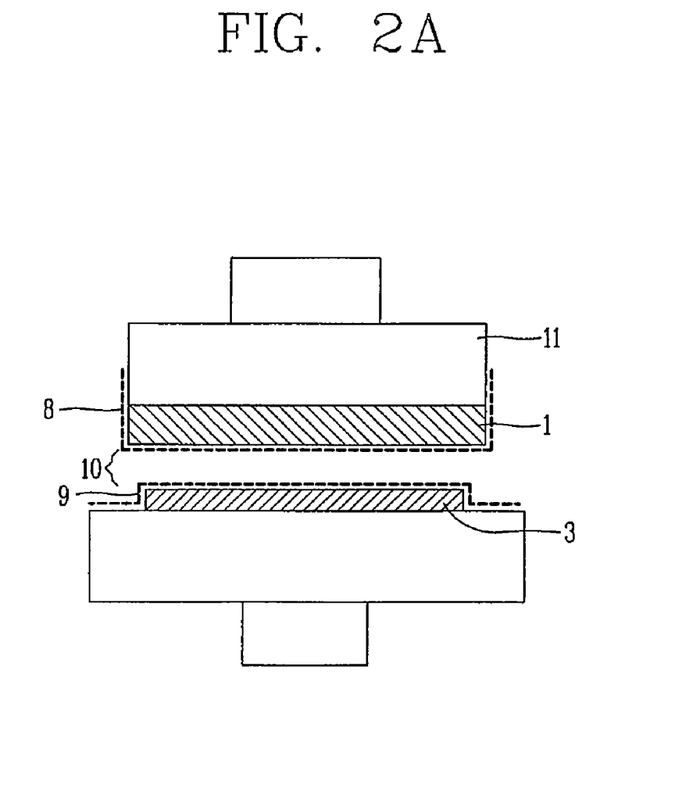
FIGS. 2A to 2D show the change of an anode glow and a cathode glow according to the change of a discharge voltage and a discharge current under the same chamber gas pressure according to the present invention.
Figure 2B:
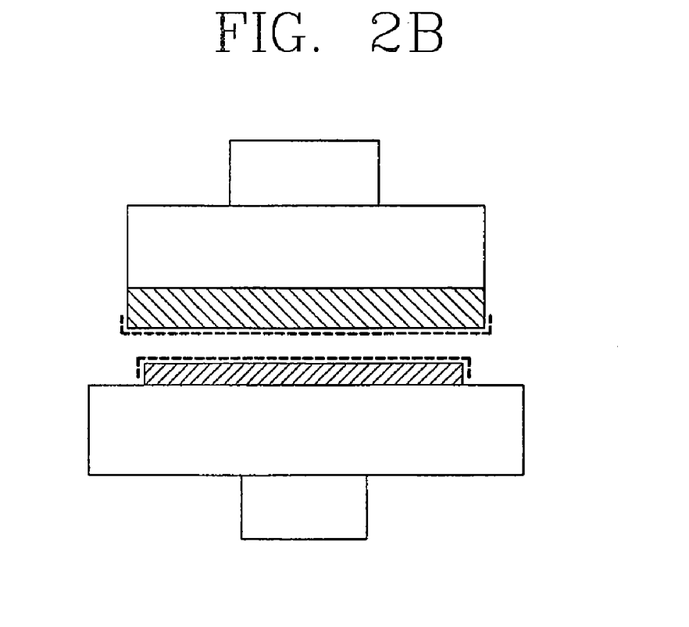

In accordance with the present invention, an NCD thin film can be easily deposited even in the absence of a positive column under a state that a cathode glow 8 and an anode glow 9 occur (FIG. 1D). However, as shown in FIG. 2D, if the cathode glow 8 and the anode glow 9 do not occur, the discharge completely disappears thus not to implement deposition of a nano-crystalline diamond thin film. An NCD film is deposited only on that part of the substrate contacted by the anode glow. For instance, when the anode glow contacts only a part of the substrate as shown in FIG. 2C, an NCD thin film is deposited only on that part contacted by the anode glow, but is not deposited on the rest of the substrate.

Figure 2C:
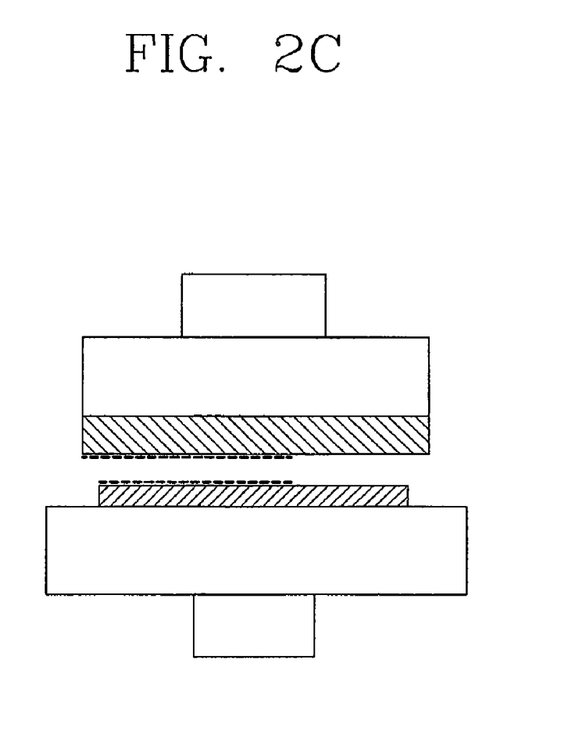
Figure 2D:
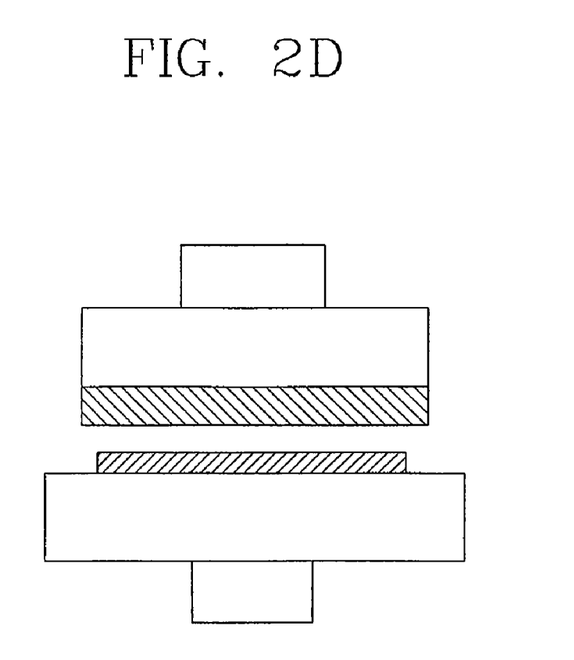
Figure 3A:
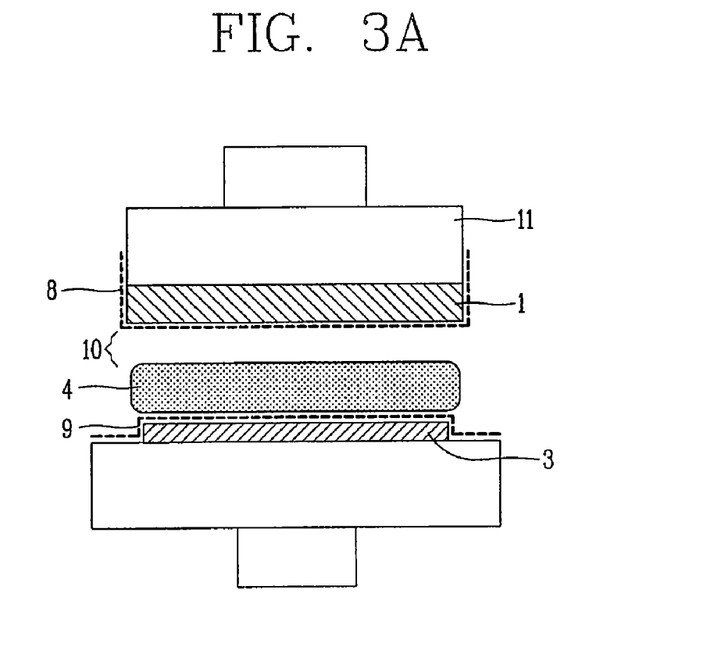
FIGS. 3A to 3D show a shape change of a positive column, an anode glow and a cathode glow according to the change of a discharge voltage and a discharge current in accordance with the conventional art.
Figure 3B:
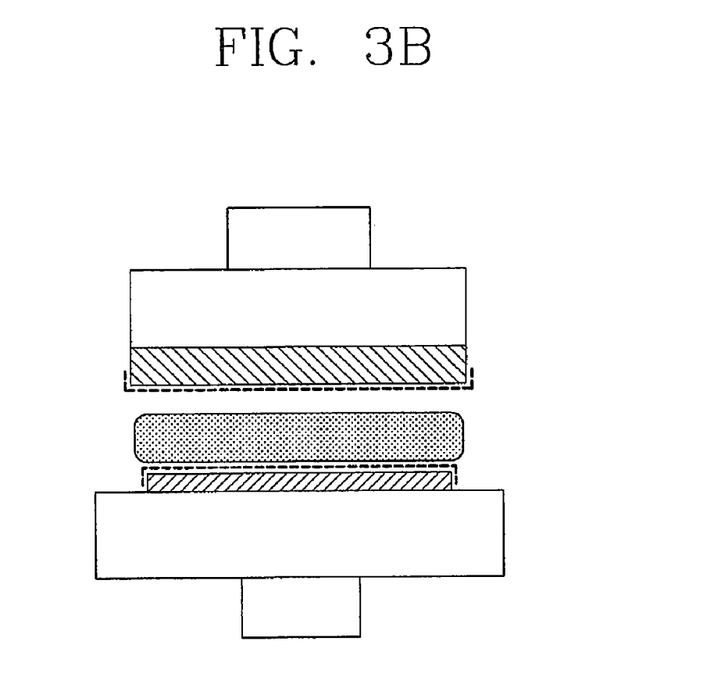
Figure 3C:
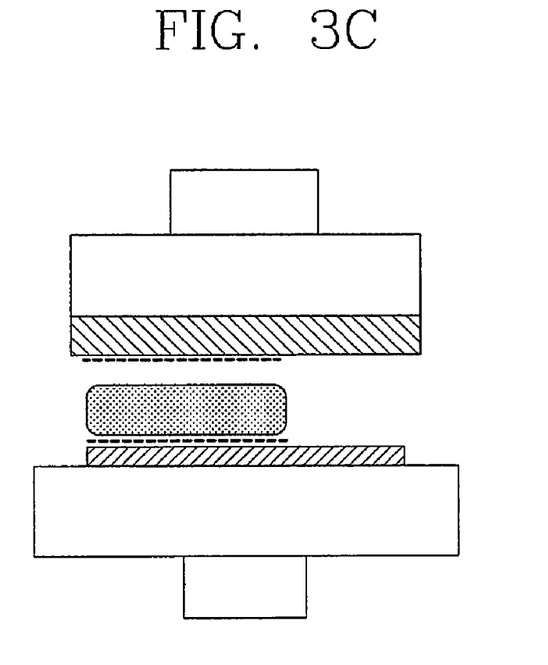
Figure 3D:
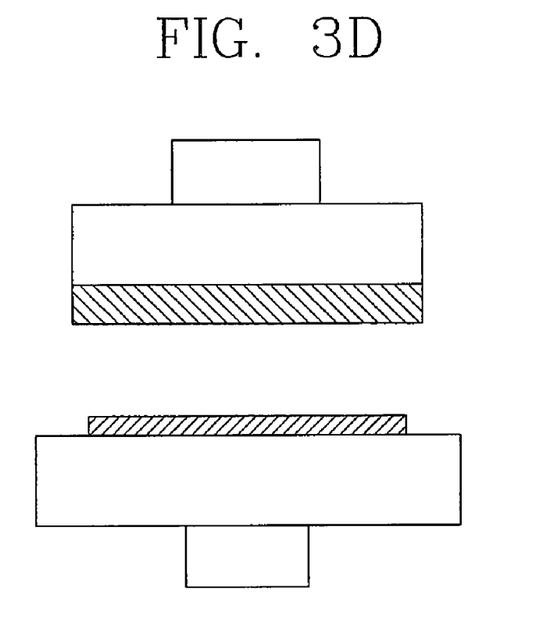

In accordance with the present invention, when the areas of the anode glow and the cathode glow are changed according to the change of the discharge voltage and the chamber gas pressure, glow parts facing each other are changed in a pair as shown in FIG. 2C, and the areas of the anode glow and the cathode glow are determined according to the chamber gas pressure, the discharge current and the discharge voltage. As shown in FIGS. 2A to 2D, when the chamber gas pressure is held constant, the areas of the cathode glow and the anode glow are decreased as the discharge current and the discharge voltage are decreased. More concretely, as the discharge current and the discharge voltage are gradually decreased under the state that the chamber gas pressure is maintained constant as in FIG. 2A, the areas of the anode glow and the cathode glow are changed diminishingly in the order of FIGS. 2A, 2B, 2C, and 2D. When the discharge current and the discharge voltage are held constant, the areas of the cathode glow and the anode glow are decreased as the chamber gas pressure is increased. More concretely, as the chamber gas pressure is gradually increased under the state that the discharge current and the discharge voltage are constantly maintained as in FIG. 2A, the anode glow and the cathode glow diminish in area in the order of FIGS. 2A, 2B, 2C, and 2D. The areas of the cathode glow and the anode glow can be easily controlled in the above manner, for thereby more easily depositing an NCD thin film on a specific part of the substrate.

The present invention may be applied not only to a planar substrate such as a silicon wafer but also to a curved substrate by having two curved electrodes facing each other. For instance, even when the cathode has a concave surface and a substrate which also serves as an anode has a convex surface concentric with the cathode, the inter-electrode distance is reduced so as not to generate a positive column. Here, the areas of the cathode glow and anode glow can be controlled by controlling the chamber gas pressure, the discharge voltage and the discharge current. An NCD thin film is deposited on the substrate with which the anode glow contacted.

In the present invention, the cathode does not react with hydrogen and nitrogen. The cathode is formed of a refractory metal having no solubility with hydrogen and nitrogen. For instance, the cathode is formed of a refractory metal such as tungsten or an alloy having similar characteristics. In the conventional art, the cathode has only to be formed of a general refractory metal, but is not limited to be formed of a refractory metal such as tungsten that does not react with hydrogen and nitrogen. When a mixed gas such as hydrocarbon-nitrogen-hydrogen is used as reaction gas under a state that the cathode is formed of molybdenum or tantalum, arcing frequently occurs between the cathode and the substrate. Consequently, the substrate and the electrodes may be damaged, and impurities may be introduced into the NCD thin film. However, when the cathode is formed of tungsten, the above problems do not arise.

Molybdenum and tantalum are different from tungsten in reacting with hydrogen, nitrogen, and carbon. This difference is shown from the binary phase diagrams (Binary Alloy Phase Diagrams, American Society for Metals, $1^{st}$ ed., 1986). Molybdenum and tantalum have a high solubility with hydrogen, nitrogen, and carbon, and form a binary phase compound with the three gaseous elements. However, tungsten has no solubility with hydrogen and nitrogen, and forms no compounds with hydrogen and nitrogen. Accordingly, the tungsten-hydrogen or tungsten-nitrogen binary phase diagram does not exist. That is, tungsten is inert with respect to hydrogen and nitrogen. Tungsten has solubility with carbon and forms carbides. However, when compared with molybdenum, tungsten has a higher temperature for forming carbide, a lower solubility of carbon, and narrower variety of carbide formations. Since tungsten has a higher inertness against the hydrogen or nitrogen in the source gas, compared to the tantalum or molybdenum, when being used as a cathode, arcing occurrence and impurity introduction in the cathode are prevented.

In the present invention, a process of cleaning the electrodes by a hydrogen plasma is performed during the process of depositing an NCD thin film, thereby completely removing contaminants on the cathode and the anode (or a substrate holder) and thus essentially preventing arcing occurrence. Since a plasma containing carbon is used in the process for depositing an NCD thin film, an NCD thin film is deposited on the substrate serving as the anode whereas solid carbon is deposited on the cathode. The solid carbon is easily observed on the cathode by naked eye after the deposit process is finished. The solid carbon is also formed on the anode on which the substrate is mounted, or on an exposed part of the substrate holder supporting the substrate.

When the deposit process is started under a state that solid carbon does not exist on the electrode, arcing does not occur even if the solid carbon is formed on the electrode during the deposit process. On the other hand, after the deposit process is finished, if the electrode contaminated by the solid carbon is cleaned by some mechanical means and then the deposit process is re-started, arcing may occur thus to damage the substrate. If the next deposition process is performed under the state that the electrode contaminated with the solid carbon is not cleaned, arcing does not occur initially, but arcing occurs after several hours' lapse thus disrupting the normal deposition process. The problem also arises even when the electrode is formed of tungsten and Ar is not used as reaction gas.

In the present invention, if a contaminated portion of the electrode is exposed to the cathode glow or the anode glow for a certain time by performing a discharge using only hydrogen after firstly cleaning the electrode mechanically, arcing does not occur during the deposit process thus to implement the same excellent deposition as in the initial condition. During the cleaning process, the discharge current, discharge voltage, chamber gas pressure, inter-electrode distance, etc. are maintained to be similar to those during the deposition. The discharge voltage is automatically controlled according to the discharge current, which is lower by approximately 70~80V than that during the deposit process. During the early part of the cleaning process, arcing occurs intermittently and then the number of times that arcing occurs decrease. However, no arcing occurs after approximately 1 hour. After the cleaning process is performed for approximately 1~2 hours in a state of no arc occurrence, the cleaning process is completed. Then, if the deposit process is re-started, a stable deposit process with no arcing is obtained.

In the present invention, Ar is not used as reaction gas. In the conventional art, Ar is widely used as reaction gas for deposit of an NCD thin film by a microwave excited plasma process. As different from the microwave excited plasma method using no electrode, if Ar is used as reaction gas in the method and apparatus of the present invention using a DC plasma, impurities are introduced into the cathode. This problem arises irrespective of the cathode material. When Ar was not used as reaction gas, an excellent NCD thin film was deposited. However, when Ar was used as reaction gas, carbide of the cathode material is incorporated into the deposited film as impurity. Ar as it is a mono-atomic molecule, has a low ionization energy, and has a mass larger than that of hydrogen thus to have a large sputtering yield. Accordingly, Ar is mainly used in generating a plasma for a sputtering process. When Ar is used in a DC plasma assisted CVD process, the Ar ions collide with the surface of the cathode thus to cause a sputtering phenomenon and to cause impurities to be introduced into the cathode.

The sputtering phenomenon occurs notably when a discharge is formed at a pressure less than 1 Torr due to a pressure dependency characteristic of mean free path of Ar. In the present invention, a deposit process itself is performed at a high pressure of more than several tens of Torr. Accordingly, the sputtering phenomenon does not greatly occur during a normal deposit process. However, in general, a discharge using a DC plasma is ignited at a low pressure of less than 1 Torr, and the discharge current right after the ignition is less than 1A which is very low. Increasing of the chamber gas pressure up to a high pressure of several tens of Torr (50~400 Torr) required during the deposit process, thereby a gradual increasing of the discharge voltage and the discharge current are necessarily performed early in the deposit process. In the process, the chamber gas pressure passes through the low pressure region where the sputtering occurs.

In the present invention, a mixed gas of hydrocarbon (e.g., methane)-nitrogen-hydrogen is used as reaction gas, in amounts of 0.5~10%, preferably, 1~7% of methane, and 0.05~1%, preferably, 0.3~0.7% of nitrogen (hereinafter, % is vol. %). In the conventional art, reaction gas obtained by mixing less than 0.5% of methane and 0.3~0.5% of nitrogen to hydrogen is used. However, in the present invention, an NCD thin film is not deposited under the conditions of the conventional art. If 0.5~10% of methane in an amount corresponding to 10 times as much as the content of nitrogen and nitrogen in an amount corresponding to approximately 1/10 of the methane are used, an excellent NCD thin film is deposited. When the temperature of the substrate is low in the absence of nitrogen, arcing occurs thus to disable a normal deposit process. When the temperature of the substrate is high in the absence of nitrogen, the amount of arcing is decreased and a normal deposit is performed. However, only an NCD thin film having a large grain size of micro-meter level is deposited, but an NCD thin film having a grain size less than several tens of nano-meters is not deposited.

When nitrogen is not used, an NCD thin film is not formed since a formed diamond thin film has a grain size of μm level, which thusly formed diamond thin film (MCD) is a nonconductor having a large resistance. However, when nitrogen is used, an NCD thin film is formed and the resistance of the NCD thin film is by far low. In a DC discharge method, the substrate and the diamond thin film deposited on the substrate constitute parts of the dc circuit. Accordingly, if the diamond thin film coated on the substrate does not have conductivity during the deposit process, charges are accumulated on the diamond thin film thus polarizing the substrate, which eventually disrupt the discharge by the arcing. In the present invention, several percent of methane and nitrogen in an amount corresponding to approximately 1/10 of the methane are used, thereby implementing deposition of an NCD thin film having fine grains with a nano-meter size. Also, since a formed diamond thin film has a low resistance, charge accumulation on the substrate and the NCD thin film deposited thereon is prevented even if the temperature of the substrate is low, thereby a discharge may be maintained stably. When the temperature of the substrate is high in the absence of nitrogen, a diamond thin film can be conductive due to a thermal activation therein. However, its application is limited since the temperature of the substrate is high, and the diamond thin film has a large grain size of micro-meter level thus disrupting deposition of the NCD thin film.

In the present invention, an arc management method is used in a manner which is different from the conventional art. No arcing occurs between the cathode and the substrate during the deposition process according to the present invention. Even when the deposit time is longer than 50 hours, no arcing occurs. However, at the early stage where the chamber gas pressure, the discharge current and the discharge voltage are gradually increased from the initially small values right after the plasma ignition to the higher values required for the deposition process, a small amount of arcing may occur. A small amount of arcing may occur for the reasons other than to the contamination of the electrode. Here, an arcing control cycle has to be utilized for promptly suppressing arcing and preventing damage to the substrate and the electrode.

Figure 4A:
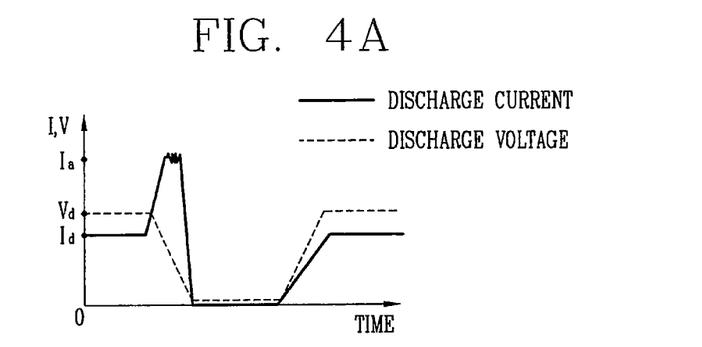
FIG. 4A shows a method for managing an arc in accordance with the conventional art.
Figure 4B:
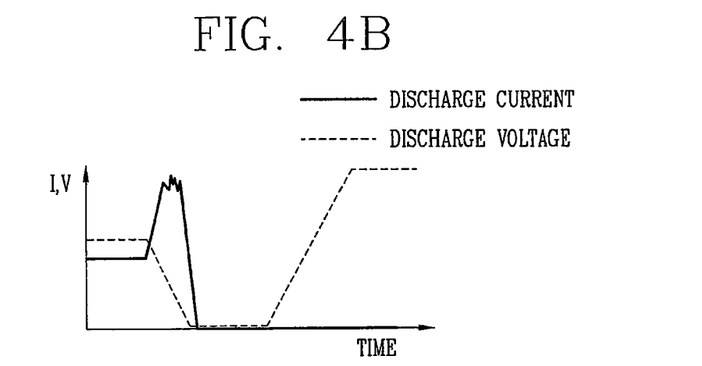
FIG. 4B shows a failed state of a plasma re-ignition after removing the arc when the method of (A) is applied to a DC plasma having a high pressure more than several tens of Torr.

FIG. 4A shows an arcing control method in accordance with the conventional art. At the time of an arc occurrence, a surge in the discharge current occurs. Accordingly, the power supplied to the electrode is instantaneously shut down thus to maintain the discharge voltage and the discharge current at '0' for a short time. Then, when the arc is extinguished, the discharge voltage and the discharge current are restored into the original values. However, the conventional arc control methods are limited to be applied in a sputtering process (U.S. Pat. No. 6,521,099) or in a vacuum arc process (U.S. Pat. No. 4,936,960), in which a low chamber gas pressure less than 1 Torr is used. However, in the present invention, the chamber gas pressure is higher than 50~400 torr which is higher than in the conventional art by few hundred times. When the conventional arc control method of FIG. 4A is applied to a DC plasma CVD apparatus employing a high chamber gas pressure as in the present invention, plasma re-ignition may frequently fail during an arcing control cycle, which FIG. 4B schematically shows the behavior of the discharge voltage and the discharge current according to time. Right after arcing occurrence, current increase due to the arcing is prevented by cutting off the voltage. However, after extinguishing the arc, even if the voltage is increased to a value higher than that required for a normal discharge voltage, the original discharge current is not restored thus to accidentally extinguish the discharge.

Figure 4C:
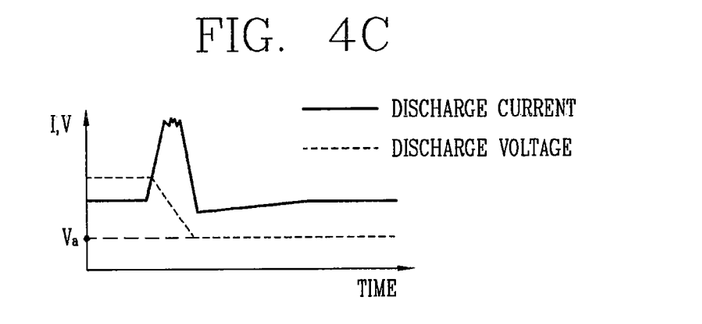
FIG. 4C shows the case where only the current-limiting function is operated.

FIG. 4C shows an arcing control method using a simple current limiting function. When the current is lowered to a normal discharge current right after arcing occurrence, the arc is not extinguished and thereby a low discharge voltage is abnormally maintained.

Figure 4D:
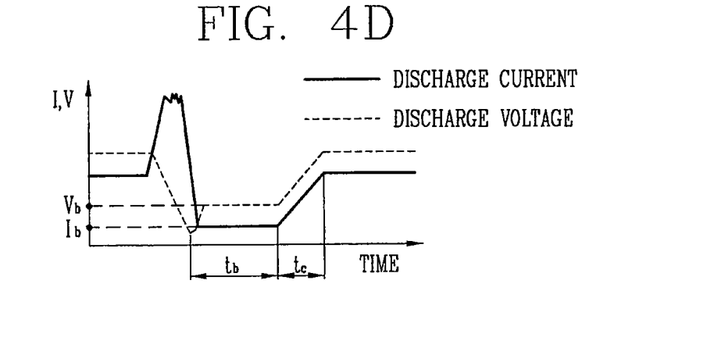
FIG. 4D shows a method for managing an arc according to the present invention.

FIG. 4D shows arcing controlling method according to the present invention. In the conventional art, the power is completely cut-off right after arcing occurrence, and thus the voltage applied to the electrode is completely '0'. However, in the present invention, power is not cut-off right after arcing occurrence, and the discharge voltage and the discharge current are set to be intermediate values ($V_b$ and $I_b$) higher than '0' but lower than the values thereof in a normal discharge state. The values $V_b$ and $I_b$ are controlled according to a discharge characteristic. When the time period $t_b$ for maintaining the values $V_b$ and $I_b$ expires, the discharge voltage and the discharge current are gradually increased thus to be restored to their values ($V_d$, $I_d$) before the arc occurrence. Here, the discharge voltage and the discharge current are not immediately restored but are restored over a time period $t_c$. The time period, $t_c$ is adopted so as to prevent an arc re-occurrence.

The arc-control method according to the present invention will be explained with reference to FIGS. 2A to 2D. FIGS. 2A and 2B show a normal deposit process. When the discharge voltage and the discharge current are instantaneously cut-off at the time of an arc occurrence, the discharge disappears as shown in FIG. 2D via the stages sequentially shown in FIGS. 2A, 2B, and 2C. As a result of investigating the above process by a slow manual control, when the above process is performed within a short time of several tens of msec, the discharge is sometimes restored, but frequently extinguished.

In accordance with the present invention, at the time of an arc occurrence during a normal deposition process as shown in FIGS. 2A and 2B, when the discharge voltage and the discharge current are decreased thus to be in a state as shown in FIG. 2C, the arc is extinguished but the cathode glow and the anode glow partially remain, not being extinguished. Here, if the discharge voltage and the discharge current are restored to their original values, the discharge is restored to its normal deposition process discharge state shown in FIG. 2B or 2A, which equally occurs when a positive column exists as shown in FIG. 3. The above result was observed when an operator manually performed the control process slowly. Even if the discharge is automatically controlled by a power supply within a short time of several tens of msec, the same result can be expected.

The present invention is distinguished from the conventional method for depositing an NCD thin film (U.S. Pat. No. 6,042,900) in that the substrate is mounted on the anode thus to serve as a part of the anode, and the anode glow contacts the surface of the substrate. In the conventional art, a grid-shaped anode is additionally installed between the substrate and the positive column, thereby preventing the substrate from electrically contacting the anode, but a grid pattern remains on an NCD thin film deposited on the substrate due to the shadowing effect of the grid. However, in the present invention, the above problem does not occur since the substrate also serves as a part of the anode.

The present invention is differentiated from the conventional method for depositing an NCD thin film in which a substrate is mounted on a cathode and a ring-shaped anode is used (Gouzman et al, Diamond and Related Material 7 (1998) 209~214). When the substrate is mounted on the cathode, cations formed in a space between the electrodes collide with the surface of the substrate. The cations are generated from carbon, nitrogen, or hydrogen, or a compound therebetween, and have a mass larger than that of an electron. Accordingly, a thin film formed on the substrate may be damaged due to the collisions of the heavy cations. However, in accordance with the present invention, the substrate is mounted on the anode, and an electron colliding with the anode has a mass much smaller than that of cation. Accordingly, a thin film deposited on the substrate is not damaged. The conventional ring-shaped anode does not cause a problem when a cathode (a substrate) has a small diameter within 10 mm, but causes a non-uniform deposition due to a non-uniform electric field when the cathode has a a diameter as large as several inches). In accordance with the present invention, since the substrate having two electrodes facing each other has a solid plate form, the above problem does not occur.

EXAMPLE 1

Under the conditions that the distance (13') between electrodes was 4 mm, the discharge voltage was 485V, the discharge current was 49A and the chamber gas pressure was 150 Torr, a deposition was performed on a 4-inch silicon wafer serving as the substrate 9 as shown in FIG. 1D. The diameter of a cathode 1 was 130 mm. Mixed gas composed of 3 vol. % $CH_4$-0.3 vol. % $N_2$-$H_2$ was used as reaction gas, and the flow rate was 150 sccm. Although not shown in FIG. 1D, a silicon wafer was mounted on a jig having a thickness of 10 mm and a diameter of 102 mm, and the jig was mounted on the anode 2. Here, a positive column was not observed, but only a cathode glow 8 and an anode glow 9 were observed, as shown in FIG. 1D.

As shown in FIGS. 2A to 2D, the size of the cathode glow 8 changed according to the discharge voltage, the discharge current and the chamber gas pressure. As shown in FIG. 2A, when the discharge voltage and the discharge current were gradually decreased from the state that the cathode glow 8 covered the bottom and side surfaces of the cathode 1 at the same time, the area of the cathode glow 8 and that of anode glow 9 gradually decreased as shown in FIGS. 2A, 2B and 2C. When the discharge voltage and the discharge current were drastically decreased, the cathode glow and the anode glow disappeared and thereby the discharge was extinguished as shown in FIG. 2D. The extinguished discharge could not be recovered even by restoring the original discharge voltage. In Example 1, the conditions of FIG. 2B were maintained.

The deposition time was changed within a range of 4~50 hours. During the deposition time, no arcing occurred. Thermal contact between the bottom surface of the jig and the surface of the anode, and thus the temperature of the side surfaces of the jig on which the silicon wafer was disposed was maintained approximately 820° C. as measured by an optical thermometer.

As an X-ray diffraction (XRD) analysis result of a deposited thin film, a diffraction peaks of {100} and {200} faces of a crystalline diamond structure was distinctively observed but no diffraction peak of an impurity phase was observed. According to a Selected Area Electron Diffraction (SAED)

analysis, the same result obtained in which a diffraction pattern of a diamond crystalline structure was distinctively observed but not any of the impurity phase. According to a Near-Edge X-ray Absorption Fine (NEXAF) analysis, the same result was obtained. By a high—resolution scanning electron microscope, a dense nanocrystalline continuous film structure having no pores was observed, in which the grain size was less than approximately 10 nm irrespective of the thickness of the film. By a Transmission Electron Microscope (TEM), a grain size less than 10 nm was observed. According to an Atomic Force Microscopy (AFM) analysis, the surface roughness of the film was less than approximately 20 nm. The thin film showed the same characteristics irrespective of position on the 4-inch wafer. The deposition rate was approximately 400 nm per hour, which was also constant irrespective of the position of the thin film on the 4-inch wafer.

EXAMPLE 2

Under the state that the cathode had a thickness of 15 mm and a diameter of 130 mm and the material of the cathode was changed to molybdenum, tantalum, and tungsten under the conditions of Example 1, a nano-crystalline diamond thin film was deposited, and the plasma stability during the deposition and the characteristics of the deposited nano-crystalline diamond thin film were observed.

As a result, when the cathode was formed of molybdenum or tantalum, arcing frequently occurred during the deposition thus to greatly damage the silicon substrate. Accordingly, molybdenum carbide or tantalum carbide were observed in the deposited nano-crystalline diamond thin film, respectively. That is, when the cathode was formed of molybdenum or tantalum, not only an X-ray diffraction pattern having a diamond diffraction peak but also a diffraction peak of a carbide of molybdenum or tantalum were observed. According to the NEXAF method, impurities of the cathode such as carbide were observed.

On the contrary, when the cathode was formed of tungsten, no arcing occurred during the deposition, and no impurities of tungsten were observed in the deposited nano-crystalline diamond thin film.

EXAMPLE 3

In the same manner as in Example 1, a nano-crystalline diamond thin film was deposited on a 4-inch silicon substrate for approximately 4~50 hours, and then only the silicon substrate was replaced without cleaning the cathode and the jig, and then the deposition was performed under the same conditions. Here, arcing occurred between the cathode and the jig, or between the cathode and the silicon substrate, thereby damaging the silicon substrate and the cathode.

When the same deposition was performed under the same conditions as in Example 1, and then solid carbon coated on the cathode and the jig was removed mechanically using sandpaper, and then the deposition was performed, the same arcing occurred thus to damage the silicon substrate and the cathode.

On the contrary, when the cathode and the jig were cleaned mechanically using abrasives such as sandpaper and the jig not having the silicon substrate thereon was exposed to a hydrogen plasma thus to clean the cathode and the jig for a certain time, and then the deposition was performed under the same conditions, an excellent deposition was performed like in Example 1. Here, the discharge voltage during the hydrogen-plasma cleaning process was 410V, the discharge current was 45~49A, the chamber gas pressure was 150 Torr and the inter-electrode distance was approximately 4 mm. At the early stage that the cathode and the jig were cleaned by being exposed to a hydrogen plasma, arcing occurred intermittently between the cathode and the jig or between the two electrodes. Then, the number of times that arcing occurred was decreased, and no arcing occurred after approximately one hour lapsed. The cathode and the jig were continuously cleaned in a hydrogen plasma atmosphere for approximately 1~2 hours under a state that no arcing occurred. Then, the cleaning operation was completed and the deposition process of Example 1 was performed, thereby implementing a stable deposition having no arc occurrence.

COMPARISON EXAMPLE 1

When the inter-electrode distance was increased to 30 mm under the same conditions as in the Example 1, the discharge voltage was increased to approximately 900V. Accordingly, the supplied power was increased by approximately two times, and the temperature of the silicon wafer was increased excessively thus to approach the melting point, thereby not enabling a normal deposition. In the Example 1, no arcing occurred during the deposition. However, in the Comparison Example 1, arcing frequently occurred between the cathode and the silicon substrate.

The reason for this was because an arc frequently occurs as the strength of the local electric field on the cathode is increased, and the local electric field on the cathode is increased according to the discharge voltage applied between the electrodes.

COMPARISON EXAMPLE 2

A diamond thin film was deposited under the same conditions as in the Example 1 except that nitrogen was not used. That is, a deposition was performed by using reaction gas obtained by mixing 3% of methane to hydrogen without nitrogen (3% $CH_4$-$H_2$), and the result thereof was compared with the results of Example 1.

As a result of the comparison, the plasma stability, the grain size of the deposited diamond thin film and conductivity were varied greatly according to whether nitrogen was used. When nitrogen was not used, arcing frequently occurred between the cathode and the silicon substrate at the early stages of the deposition process at the deposition temperature as low as 820° C. Accordingly, the silicon substrate was greatly damaged thus not to enable a normal deposition process. When the temperature of the jig was maintained at approximately 1000° C. higher than that in Example 1, the number of times that arcing occurred was decreased and a diamond thin film was deposited on the silicon substrate. However, a micro-crystalline diamond thin film having a large grain size corresponding to several micrometers was observed by a scanning electron microscope (SEM) and a transmission electron microscope (TEM). Here, a nano-crystalline diamond thin film having a grain size less than several tens of nm was not observed. Measurement of the sheet resistance of the diamond thin film deposited on the 4-inch silicon wafer with a thickness of approximately 1.5 μm was attempted by a 4-point probe method. However, the sheet resistance was not measured due to its large value. In the case of Example 1 where nitrogen was used under the same conditions, a thin film having a thickness of approximately 1.5 μm showed a low sheet resistance of approximately several hundreds of ohm/$cm^2$.

COMPARISON EXAMPLE 3

As reaction gas, 0.3%~0.5% $CH_4$-0.15% $N_2$-$H_2$ was used under the same conditions as in Example 1, and the result thereof was compared with the result of Example 1.

As a result of the comparison, a diamond thin film was found not to have been deposited.

The present invention may be applied so that a nano-crystalline diamond (NCD) thin film can be deposited not only on a planar substrate but also on a curved substrate.

The present invention may also be applied to deposition of the conventional micro-crystalline diamond (MCD) film or a single-crystalline diamond thin film using a DC plasma processing. Furthermore, the present invention may be applied to a process for depositing a material other than diamond by using a DC plasma.

According to the present invention, a nano-crystalline diamond thin film can be easily obtained by excluding a positive column that has been regarded as a necessary component for growing a diamond thin film. In accordance with the present invention, the silicon substrate is prevented from being overheated, power consumption is decreased, and arc occurrence between the cathode and the silicon substrate is prevented by various techniques. The diamond thin film fabricated in accordance with the present invention is uniform, and has excellent crystallinity having no impurity.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described here may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for depositing a material in the absence of a positive column, comprising a cleaning step and a depositing step,
   wherein the cleaning step comprises
      a) introducing a hydrogen gas to a chamber, and
      b) performing a cleaning for each surface of a cathode and an anode in the chamber by a cathode glow and an anode glow, wherein the cathode glow and the anode glow are generated by a plasma discharge under a hydrogen gas pressure of 50 to 400 Torr,
   wherein the depositing step comprises
      i) introducing a chamber gas comprised of methane, nitrogen and hydrogen into the chamber with a chamber gas pressure of 50 to 400 Torr, wherein Ar gas is not used as a part of the chamber gas,
      ii) generating a plasma discharge between the cathode and the anode by applying a DC voltage, wherein the cathode and the anode face each other with a distance of less than 5 mm, and
      iii) depositing a material containing nano-crystalline diamond on the anode or on a substrate mounted on the anode, under existence of a cathode glow and an anode glow; and
   wherein the cathode is formed of tungsten.

2. The method of claim 1, wherein the chamber gas of the depositing step is comprised of 1 to 7 vol. % of methane, 0.3 to 0.7 vol. % of nitrogen, and the reminding part of hydrogen.

3. The method of claim 1, wherein the nano-crystalline diamond has an average particle size of not more than 10 nm.

4. The method of claim 1, wherein the cleaning step further comprises a step of cleaning each surface of the cathode and the anode mechanically, before the step a).

* * * * *